United States Patent [19]

D'Amato

[11] Patent Number: 5,065,944
[45] Date of Patent: Nov. 19, 1991

[54] REINFORCED SPRAY MANIFOLD

[75] Inventor: Mark D'Amato, Montreal, Canada

[73] Assignee: D.E.M. Controls of Canada, Montreal, Canada

[21] Appl. No.: 615,178

[22] Filed: Nov. 19, 1990

Related U.S. Application Data

[63] Continuation-in-part of Ser. No. 385,354, Jul. 27, 1989, Pat. No. 5,000,388.

[51] Int. Cl.$^5$ .............................................. B05B 1/14
[52] U.S. Cl. .................................... 239/550; 239/560
[58] Field of Search ............... 239/550, 556, 557, 560, 239/565, 567, 568, 600; 285/188; 138/172

[56] References Cited

U.S. PATENT DOCUMENTS

| 1,032,860 | 7/1912 | Possons | 239/565 |
| 1,177,884 | 4/1916 | Moletsa et al. | |
| 1,208,706 | 12/1916 | Hatfield | |
| 1,461,034 | 7/1923 | Frisbie | |
| 1,590,195 | 6/1926 | Kerr | |
| 1,632,370 | 6/1927 | Cruncleton et al. | |
| 2,900,992 | 3/1956 | Johnson | 134/122 |
| 2,940,466 | 6/1960 | Speights | 137/356 |
| 3,423,029 | 1/1969 | Demaison | 239/565 |
| 3,831,681 | 8/1974 | Livingston | 169/16 |
| 4,349,073 | 9/1982 | Zublin | 166/312 |
| 4,706,889 | 11/1987 | Hofmann | 239/550 |
| 4,895,099 | 1/1990 | D'Amato | 118/58 |
| 4,964,365 | 10/1990 | D'Amato | 118/419 |

FOREIGN PATENT DOCUMENTS 521106 7/1953 Belgium .
320453 10/1929 United Kingdom ............... 239/565

OTHER PUBLICATIONS

Industrial Catalog 27, Spraying Systems Co., North Avenue at Schmale Road, Wheaton, Ill. 60187.
Albuz, Les Buses De Pulverisation Agricole De A a Z (Catalog).

Primary Examiner—Andres Kashnikow
Assistant Examiner—Lesley D. Morris
Attorney, Agent, or Firm—Stetina and Brunda

[57] ABSTRACT

A reinforced spray manifold for spraying liquid chemicals, suspensions and solutions upon workpieces such as printed circuit boards. The spray manifold comprises a generally rectangular periphery with a plurality of inner members disposed therein and fluidly connected thereto. The rectangular periphery and each of the inner tubular members include at least one longitudinally extending rib member formed thereon which is used to impart greater structural rigidity to the manifold. Spray nozzles mounted within the rib members at various points on the manifold provide for emanation at a desired spray pattern from the manifold. The configuration and interconnection of the various components of the manifold is specifically arranged and designed to prevent turbulence of fluid flowing therewithin and to promote even and continuous fluid pressure throughout the manifold.

22 Claims, 7 Drawing Sheets

REINFORCED SPRAY MANIFOLD

The present application is a continuation in part of Applicant's Application Ser. No. 07/385,354 filed July 27, 1989 now U.S. Pat. No. 5000388.

BACKGROUND OF THE INVENTION

The present invention relates generally to the field of chemical process technology and more particularly to a reinforced spray manifold for spraying liquid chemicals, solutions and/or suspensions upon surfaces of printed circuit boards and/or similar workpieces. The reinforced spray manifold is formed having at least one longitudinally extending reinforcement rib member thereon which serves to impart additional structural rigidity to the manifold as well as provide a structure into which one or more spray nozzles may be mounted.

During the manufacture of printed circuit boards, various chemical solutions and/or suspensions are routinely applied to surfaces of the circuit boards. Examples of liquid chemicals, solutions and/or suspensions routinely applied to the surface of printed circuit boards include, but are not limited to; cleaners, etchants, plating solutions, strippers, photographic developing solutions, abrasive pumice slurries and rinse water.

Many of the liquid chemicals, solutions and/or suspensions used in the manufacture and preparation of printed circuit boards may be effectively applied to the surfaces of the circuit boards by wy of automated or semiautomated spray process machinery. Typical spray process machines used in such applications generally comprise one or more mechanical conveyors having numerous sprayer heads or nozzles positioned thereabove and/or therebelow for applying the desired chemicals, solutions and/or suspensions to circuit boards as they move along the conveyor(s) The exposure time and amount of each chemical applied to each circuit board is generally determined by a) the density of the spray, b) the regions(s) of the conveyor(s) covered by the spray and c) the speed at which the circuit boards pass through the spray-covered region(s) of the conveyor. Additionally, in some applications it is desirable that the liquid chemicals, solutions and/or suspensions be sprayed at specific angles relative to surfaces of the circuit board so as to effect desirable patterns Of flow (e.g. laminar flow) of the applied liquids, solutions and/or suspensions upon the surfaces of the circuit boards.

Although many types of spray process machines are available for use in circuit board manufacturing applications, many of the component parts (e.g., spray manifolds, conveyors, etc.) used in the construction of such prior art devices are not specifically designed for circuit board applications. In this respect, the spray manifolds used in such process machines are typically the component most unsuited for circuit board manufacturing. As previously stated, in some applications liquid chemicals are sprayed at specific angles relative to the circuit board surfaces to effect desired patterns of flow upon the surfaces. To obtain such desired flow patterns, the liquid chemicals, in addition to being sprayed at a specific angle, must also circulate within the manifold with a minimum of turbulence or disruption so as to insure an even distribution of liquid emanating from the spray nozzles mounted Within the manifold. However, currently known spray manifolds are not designed in a manner so as to obtain a minimum amount Of turbulence or disruption of the liquid therewithin. Additionally, many liquid chemicals used in circuit board manufacturing are applied to the circuit board surfaces after being heated to very high temperatures. In this regard, many currently known spray manifolds are susceptible to warpage after prolonged circulation of such heated chemicals therein. Oftentimes, this warpage will decrease the capacity of the manifold to apply an even and uniform spray coating upon the circuit board surfaces. Accordingly, there exists a need in the art for improved chemical spray machinery, and more particularly an improved spray manifold, for use in circuit board manufacturing and similar applications.

SUMMARY OF THE INVENTION

The present invention comprises a reinforced spray manifold for spraying liquid chemicals, solutions and/or suspensions on workpieces such as printed circuit boards and the like.

In accordance with the invention there is provided a reinforced spray manifold comprising a generally rectangular tubular periphery and a plurality of transverse inner tubular members disposed within and fluidly connected to the tubular periphery. A plurality of spray nozzles are fluidly connected to the tubular periphery and inner tubular members to facilitate the spraying process. Both the tubular periphery and inner tubular members of the present invention are formed of plastic pipe or similar chemical/resistant tubular stock. Additionally, the tubular periphery and each of the inner tubular members include at least one longitudinally extending rib member formed thereon. The rib members, in addition to providing greater structural rigidity to the manifolds, also provide a structure into which the spray nozzles may be mounted. The increased structural rigidity that the rib members provide is of particular importance in that certain chemicals used in the production of printed circuit board are sprayed upon the surface of the circuit boards after being heated to high temperatures. Since the manifolds are preferably constructed from plastic pipe or the like, the prolonged circulation of such heated chemicals therethrough oftentimes leads to warpage occurring within the manifold. As can be appreciated, such warpage may detrimentally effect the spray pattern emanating from the spray nozzles mounted within the manifold, thereby causing an uneven application of the chemicals upon the circuit board surfaces.

To further insure the even application of the chemicals upon the circuit board surfaces, the reinforced spray manifold of the present invention is further constructed in a manner such that liquid will circulate within the manifold with a minimum of turbulence or disruption. Such reduced turbulence gives rise to an even distribution of liquid emanating from the manifold and thus, an even spray application. In this respect, the generally rectangular tubular periphery of the manifold preferably comprises first, second and third elongate tubular segments, joined in end to end fashion so as to form three sides of the generally rectangular tubular periphery. A fourth tubular segment is bent or angled in configuration. The first end of the fourth tubular segment member is connected to the second end of the third tubular segment such that the initial portion of the fourth tubular segment extends generally perpendicular to the third tubular segment. The remainder of the fourth tubular segment turns inwardly so that the second end of the fourth tubular segment merges with, and is fluidly connected to, the first tubular segment at a point between the longitudinal ends thereof. The angle of entry of the fourth tubular segment into the first tubular segment is such that fluid flowing from the fourth tubular segment into the first tubular segment will merge, join or fuse with fluid flowing into the input end of the first tubular segment from a separate fluid supply source. Thus, any recirculating fluid and any newly entering fluid will combine with a minimum of turbulence, cavitation or disruption.

Additionally, it is preferable that the spray nozzles mounted within the rib member of the spray manifold of the present invention be resistant to abrasion, so as to be useful in the spraying of abrasive chemicals, slurries and the like. Towards such end, the preferred spray nozzles may comprise tubular outer bodies made of plastic (e.g. polypropylene) with an inner sleeve or insert formed therein. The inner sleeve or insert is generally formed of chemical resistant, nonabrasive material (e.g. ceramic).

Further objects and advantages of the invention will become apparent to those skilled in the art upon reading and understanding of the following detailed description and the accompanying drawings.

DETAILED DESCRIPTION OF THE PREFERRED EMBODIMENT

The following detailed description and the accompanying drawings are provided for purposes of illustrating presently preferred embodiments of the invention and are not intended to limit the scope of the invention in any way.

The spray manifolds 10, 10a, 12, 12a, 14, 14a, 16, 16a, 84, 84a, 86, 86a, 88, 88a, 90, 90a comprise generally tubular rectangular outer peripheries formed of fluidly connected segments with a plurality of inner pipe members or "spray bars" traversing therewithin.

Figure 1:
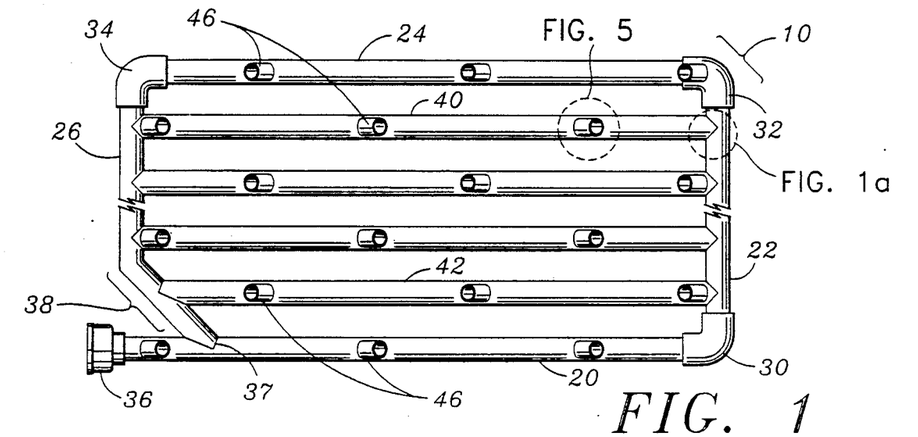
FIG. 1 is a plan view of a spray manifold having a plurality of nozzle mounting nipples arranged in a first pattern thereon.
Figure 2:
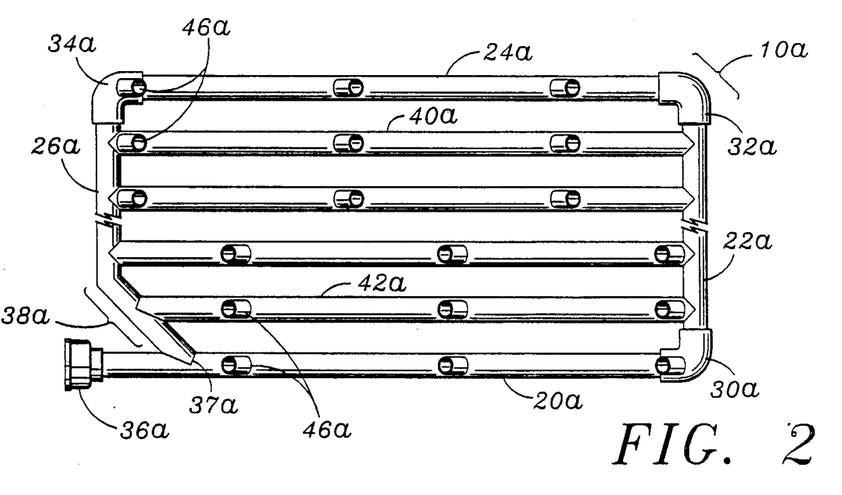
FIG. 2 is a plan view of a spray manifold of the present invention having a plurality of nozzle mounting nipples arranged in a second pattern thereon.
Figure 3:
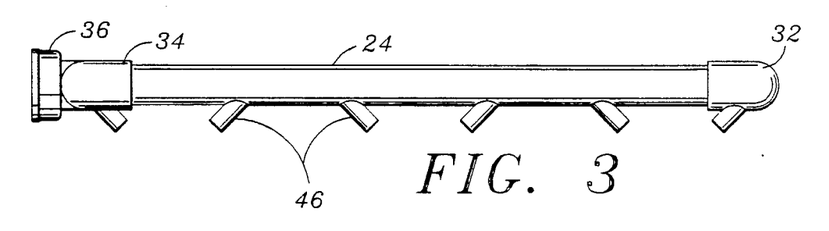
FIG. 3 is an elevational view of the spray manifold of FIG. 1.

For example, FIG. 1-2 show generic spray manifolds according to a first embodiment of the present invention and serve to depict the manner in which the spray manifolds of this embodiment are constructed. Each manifold of the first embodiment of the present invention comprises a peripheral flow path comprising first 20, 20a, second 22, 22a, third 24, 24a and fourth 26, 26a individual, peripheral tubular members. A plurality of inner tubular members 40, 40a, 42, 42a are fluidly connected to and traverse between the second tubular member 22, 22a and fourth tubular member 26, 26a.

The first 20, 20a, second 22, 22a, and third 24, 24a peripheral tubular members are substantially straight segments of pipe and are fluidly connected one to another, by way of elbows 30, 30a, 32, 32a.

The fourth peripheral tubular member 26, 26a has a bent or angled configuration. The first end of the fourth tubular member 26, 26a is connected to the second end of the third tubular member 24, 24a by way of elbow 34, 34a. The fourth tubular member 26, 26a is inwardly bent or angled. The bent or angled portion 38, 38a of the fourth tubular member 26, 26a extends inwardly such that the second end of the fourth tubular member 26, 26a meets first tubular member 20, 20a at a point between the longitudinal ends thereof. An aperture or hole extends through the outer wall of the first tubular member 20, 20a at the point where the second end of the fourth tubular member 26, 26a meets therewith. The second end of the fourth tubular member is cut radially on an angle as shown. The radially cut second end of the fourth tubular member 26, 26a is positionable over the cylindrical outer surface of the first tubular member 20, 20a around the aperture or hole formed therein. Adhesive or bonding material is applied to form a water tight seal between the second end of the fourth tubular member 26, 26a and the side wall of the first tubular member 20, 20a.

By such arrangement the fourth tubular member 26, 26a is fluidly connected to the first tubular member 20, 20a. The aperture formed in the wall of the first tubular member is approximately the same size and shape as the inner bore of the fourth tubular member 26, 26a. Thus, fluid may pass through the fourth tubular member—first tubular member joint 37, 37a with little or not turbulence or disruption.

Additionally, the acute angular entry of the fourth tubular member 26, 26a into the first tubular member 20, 20a facilitates smooth, non-turbulent fusion or joinder of fluid flowing from the fourth tubular member 26, 26a into fluid entering the first tubular member 20, 20a through coupling 36, 36a. Such non-turbulent fusion or joinder of a) the recirculating fluid with b) the newly infused fluid, ensures even and continuous fluid pressure within the manifold and avoids cavitation, flow alternation, or other flow disruptions that would likely occur if such acute angular entry were not employed.

The plurality of transverse inner tubular members 40, 40a, 42, 42a are fluidly connected to and extend between second tubular member 22, 22a and fourth tubular member 26, 26a. Such transverse inner tubular member 40, 40a, 42, 42a complete the tubular network of the manifold.

Figure 1A:
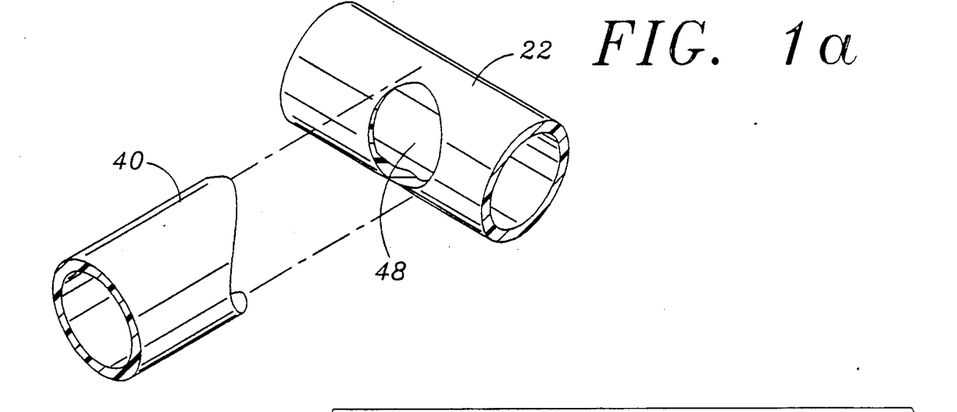
FIG. 1a is an exploded view of a portion of the spray manifold of FIG. 1 showing the manner in which the transverse pipe members are joined to the tubular periphery.

Each inner tubular member 40, 40a, 42, 42a comprises a section of pipe (e.g. PVC pipe) which is fluidly connected at either end to second tubular member 22, 22a and fourth tubular member 26, 26a. The manner in which the inner tubular members 40, 40a, 42, 42a are connected to second and fourth tubular members 22, 22a, 26, 26a is shown in the exploded view of FIG. 1a. Specifically, the ends of the inner tubular member 40 are cut radially as shown, so that the radially cut end of the inner tubular member 40 is positionable and affixable over the cylindrical outer surface of the second tubular member 22. Hole 48 is sized and configured approximately the same as the inner bore of the inner tubular member 40. Thus, when the radially cut end of inner tubular member 40 is positioned over the hole 48 of second tubular member 22, fluid may flow from second tubular member 22 into the inner tubular member 40 with a minimum of turbulence or disruption. An adhesive or other bonding material is applied to form a fluid tight union between the end of inner tubular member 40 and second tubular member 22. Such means of connecting the inner tubular members to the tubular periphery of the manifold provides for even, non-disrupted flow of fluid therebetween and therethrough.

Figure 4:
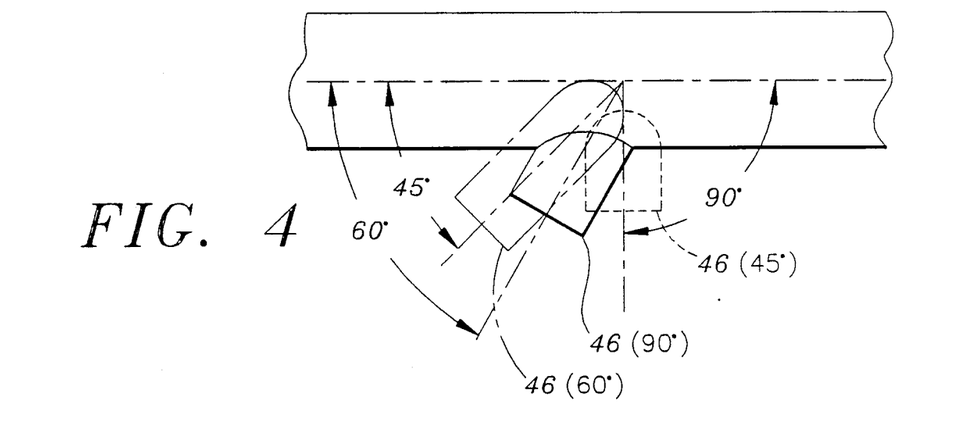
FIG. 4 is an enlarged sectional view of segment 4-5 of FIG. 1 including added illustrations of three (3) possible angular orientations of the nozzle mounting nipples attached thereto.

In the first embodiment of the present invention as shown in FIG. 1–8, a plurality of nozzle mounting nipples 46, 46a are positioned on each spray manifold. Such nozzle mounting nipples 46, 46a comprise short (e.g. less than one inch in length) segments of tubing or pipe (e.g. PVC pipe). The nipples 46, 46a are mounted on and extend from the walls of first and third tubular members 20, 20a, 24, 24a and inner tubular members 40, 40a, 42, 42a. Each individual nozzle mounting nipple 46, 46a may be connected to members 20, 20a, 24, 24a, 40, 40a, 42, 42a at any angle necessary to facilitate the desired pattern and/or overlap of the individual sprays emanating therefrom. As shown in FIG. 4, the nipples 46, 46a are routinely mounted on the manifold so as to be oriented at 45, 60 or 90 degrees relative to the major axis of the tubular member to which the nipple is attached. For example, in the manifold shown in FIG. 1, nipples 46 are aimed at approximate 45° angles.

Figure 5:
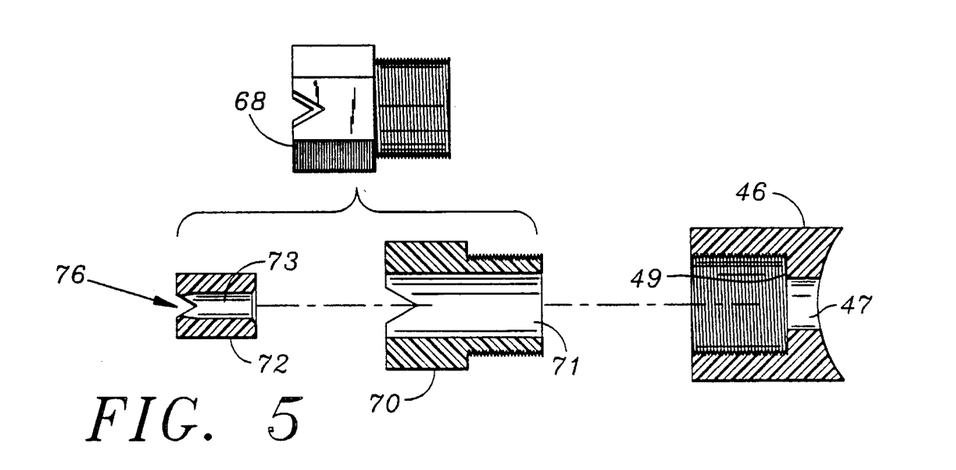
FIG. 5 is an exploded view of segment 4-5 of FIG. 1 including an exploded representation of a preferred spray nozzle mountable thereon.

Each of nozzle mounting nipples 46, 46a are sized and configured to receive and hold a spray nozzle 68 therein. A preferred type of spray nozzle 68 for use in accordance with the first and second embodiments of the present invention is shown in FIGS. 5 and 13. Such nozzle 68 comprises an outer body 70 made of plastic (e.g. polypropylene) which defines a first inner bore 71 therein, and an inner body or core insert 72 made of ceramic material (e.g. ceramic alumina). The core insert 72 is positioned within the inner bore 71 of the polypropylene outer body 70, and the polypropylene outer body 70 is partially threaded on the exterior of its base. The core 72 of each nozzle 68 includes a second inner bore 73 terminating in an aperture 76 at the distal end thereof. The size and configuration of the first inner bore 71 of the outer body 70, second inner bore 73 of core 72 and aperture 76 will determine the volume and spray pattern of spray emanating from the nozzle 68. A preferred polypropylene/ceramic alumina nozzle 68 for use in accordance with the invention is available commercially from Albuz, Ceramiques Techniques Desmarquest, Evreux, France.

With respect to the attachment of nozzle 68 to the spray manifold constructed in accordance with the first embodiment of the present invention, the nipple 46 is at least partially internally threaded so as to permit the polypropylene outer body 70 of the nozzle 68 to be rotatably advanceable into the internally threaded nipple 46. It is preferred that only the distal portion of the inner bore 47 of the nipple be threaded so that an annular shoulder 49 is formed at the base of the threaded portion, thereby providing a surface against which outer body 70 of nozzle 68 may abut when screwed fully into the nipple 46. Preferably, the width of the shoulder 49 is approximately equal to the wall thickness of the outer body 70 so that the inner bore 47 of the nipple 46 is approximately the same size of the first inner bore 71 of the outer body 70. Because the inner bore 47 of the nipple 46 and the first inner bore 71 of outer body 70 are approximately the same size, fluid is able to flow directly therethrough without unnecessary disruption or changes in pressure.

Figure 6:
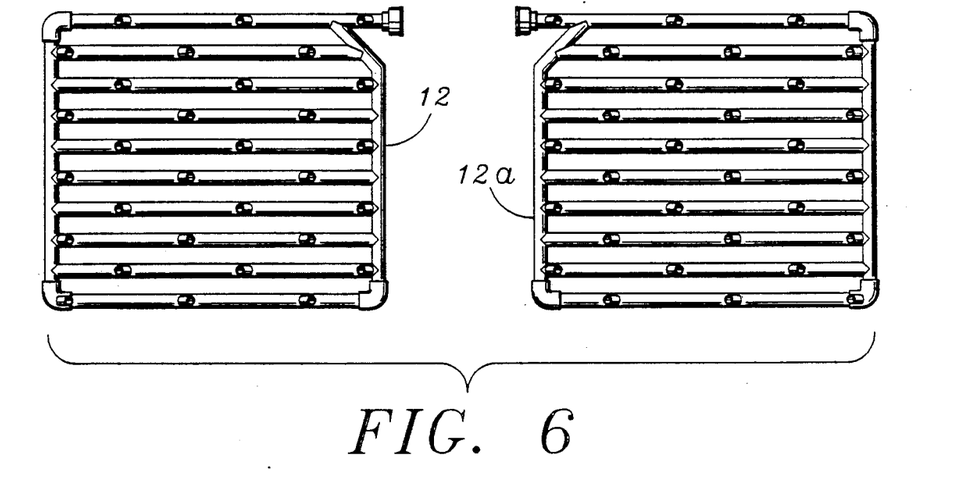
FIGS. 6-8 show several different sized manifolds, all of which embody the first embodiment of the present invention.
Figure 7:
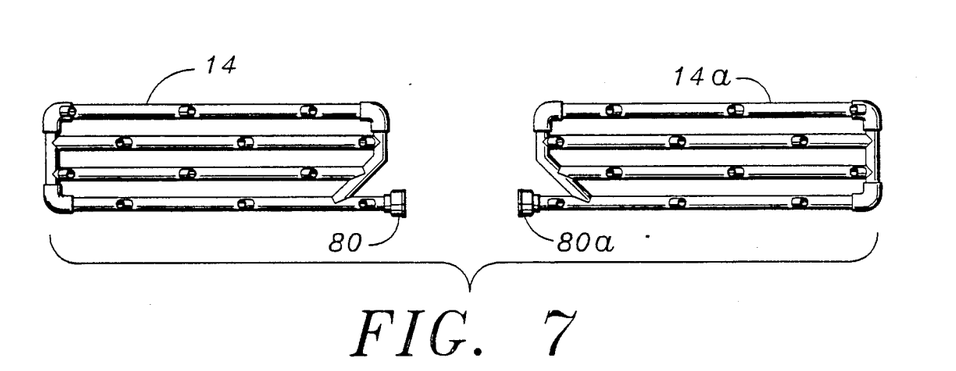
Figure 8:
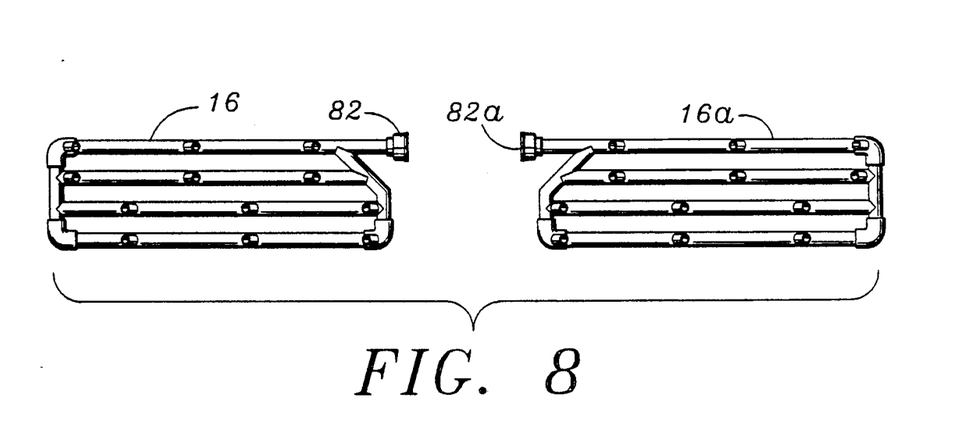

FIGS. 6–8 show several different size manifolds, all of which embody the first embodiment of present invention. Specifically, FIG. 6 shows manifolds 12, 12a having a generally rectangular tubular periphery with eight (8) inner tubular members positioned transversely therewithin. Manifold 12 is fitted for right hand connection while manifold 12a is fitted for left hand connection. Thus, manifolds 12 and 12a are essentially mirror images of one another. The nozzle pattern shown on manifolds 12 and 12a is staggered. However, it will be appreciated that any nozzle pattern may be employed depending on the intended application and desired spray pattern.

FIG. 7 shows spray manifolds 14 and 14a which comprise generally rectangular outer periphery with two (2) inner tubular members positioned transversely therewithin. The manifolds 14 and 14a are fitted for right and left hand connection respectively and are therefore mirror images of one another. The nozzle pattern shown on the manifolds 14, 14a is staggered. However, it will be appreciated that any nozzle pattern may be employed depending upon the desired application and spray pattern. The nozzles 14, 14a are provided with longer, extended couplings 80, 80a which extend outwardly from each manifold 14, 14a.

FIG. 8 shows manifolds 16, 16a, each comprising a generally rectangular outer periphery with two (2) transverse inner tubular members positioned therein. The manifolds 16, 16a differ from manifolds 14, 14a only in that they incorporate non-extended connections 82, 82a instead of the longer, extended connectors 80, 80a shown on manifolds 14, 14a.

Figure 9:
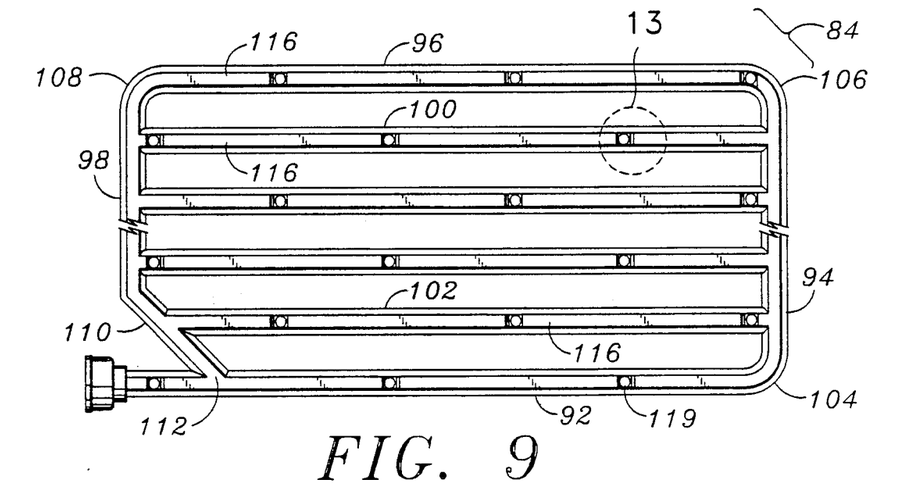
FIG. 9 is a plan view of a spray manifold of a second embodiment of the present invention having a plurality of nozzle mounting recesses arranged in a first pattern thereon.
Figures 9A, 13:
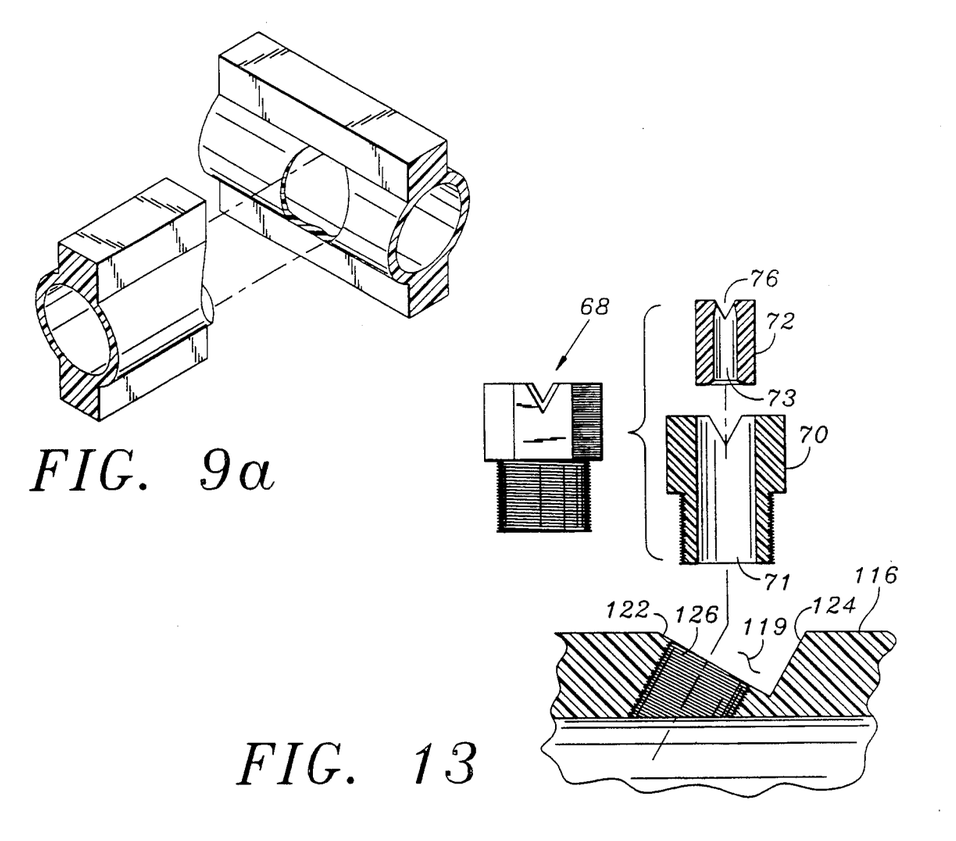
FIG. 9a is an exploded view of a portion of the spray manifold of FIG. 9 showing the manner in which the transverse pipe members are joined to the tubular periphery.
FIG. 13 is an exploded view of the sixty degree nozzle mounting recess of FIG. 12, including an exploded representation of a preferred spray nozzle mountable therein.
Figure 10:
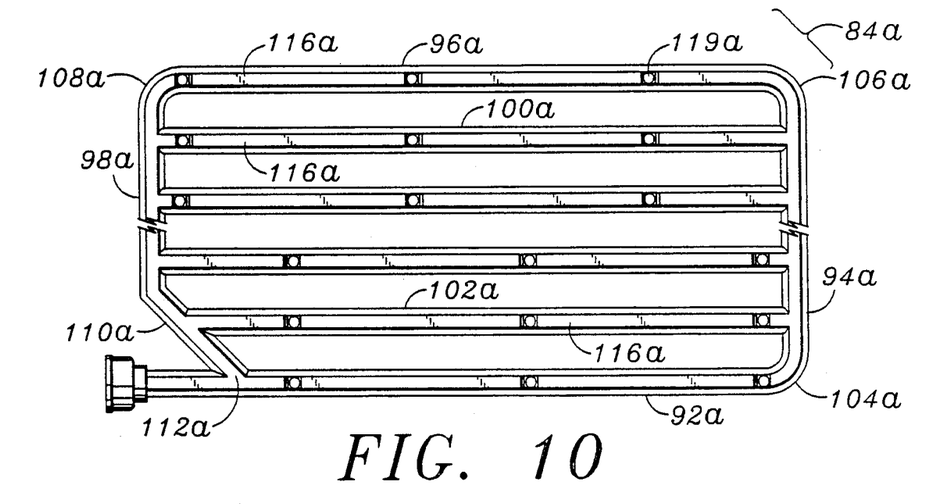
FIG. 10 is a plan view of a spray manifold of a second embodiment of the present invention having a pattern thereon.

Referring now to a second embodiment of the spray manifold of the present invention as illustrated in FIGS. 9–16, the manifold shown in FIGS. 9–10 serve to depict the manner in which the spray manifolds of the second embodiment are constructed. Referring to FIGS. 9–10, each manifold comprises a peripheral flow path comprising first 92, 92a, second 94, 94a, third 96, 96a and fourth 98, a pipe segments. A plurality of inner pipe members 100, 100a, 102, 102a are fluidly connected to and traverse between the second pipe segments 94, 94a and fourth pipe segments 98, 98a. The first 92, 92a, second 94, 94a, third 96, 96a, and fourth 98, 98a peripheral pipe segments are formed from a single, substantially straight pipe member which is bent in a manner forming elbow portions 104, 104a, 106, 106a, 108, 108a. The fourth pipe segment member 98, 98a is inwardly bent or angled. The bent or angled portion 110, 110a, of fourth pipe segment 98, 98a extends inwardly such that the open end of the fourth pipe segment 98, 98a meets first pipe segment 92, 92a at a point between the longitudinal ends thereof. An aperture or hole extends through the outer wall of the first pipe segment 92, 92a at a point where the open end of the fourth pipe segment 98, 98a meets therewith. The open end of the fourth pipe segment 98, 98a is cut radially on an angle as shown. The radially cut open end of the fourth pipe segment 98, 98a is positionable over the cylindrical outer surface of the first pipe segment 92, 92a around the aperture or hole formed therein. Adhesive or bonding material is applied to form a water tight seal between the open end of the fourth pipe segment 98, 98a and the side wall of the first pipe segment 92, 92a. By such arrangement the fourth pipe segment 98, 98a is fluidly connected to the first pipe segment 92, 92a. The aperture formed in the wall of the first pipe segment 92, 92a is approximately the same size and shape as the inner bore of the fourth pipe segment 98, 98a. Thus, fluid may pass through the fourth pipe segment—first pipe segment joint 112, 112a with little or no turbulence or disruption. Though the tubular periphery of the second embodiment is preferably formed from a single, elongate member, it will be appreciated that individual members connected by elbows, as incorporated in the first embodiment, may also be used in the construction of the second embodiment.

Additionally, the acute angular entry of the fourth pipe segment 98, 98a into the first pipe segment 92, 92a facilitates smooth, non-turbulent fusion or joinder of fluid flowing from the fourth pipe segment 98, 98a into the fluid entering the first pipe segment 92, 92a through coupling 112, 112a. Such non-turbulent fusion or joinder of the circulating fluid with the newly infused fluid, insures even a continuous fluid pressure within the manifold and avoid cavitation, flow of alteration or other flow disruptions that would likely occur if such acute angular entry were not employed. The plurality of transverse inner pipe members 100, 100a, 102, 102a are fluidly connected to and extend between second pipe segment 94, 94a and fourth pipe segment 98, 98a. Such inner pipe members 100, 100a, 102, 102a complete the tubular network of the manifold.

Each inner pipe member 100, 100a, 102, 102a comprises a section of pipe (e.g. PVC pipe) which is fluidly connected at either end to second pipe segment 94, 94a and fourth pipe segment 98, 98a. The manner in which the inner pipe members 100, 100a, 102, 102a are connected to the second pipe segment 94, 94a and fourth pipe segment 98, 98a is shown by the view of FIG. 9a. Specifically, the ends of the inner pipe member 100 are out radially as shown, so that the radially cut end of the inner pipe member 100 is positionable and affixable over the cylindrical outer surface of second pipe segment 94. A hole 114 is cut in the wall of second pipe segment 94. Hole 114 is sized and configured approximately the same as the inner bore of the inner pipe member 100. Thus, when the radially out end of inner pipe member 100 is positioned over the hole 114 of second pipe segment 94, fluid may flow from the second pipe segment 94 into the inner pipe member 100 with a minimum of turbulence or disruption. An adhesive or other bonding material is applied to form a fluid tight union between the end of inner pipe member 100 and the second pipe segment 94. Such means of connecting inner pipe members 100, 100a, 102, 102a to the tubular periphery of the manifold provides for even, non-disrupted flow of fluid therebetween and therethrough.

In the second embodiment of the present invention, the member used to form the tubular periphery and the inner pipe members 100, 100a, 102, 102a each formed with a lower rib member 116, 116a and an upper rib member 118, 118a extending longitudinally thereon. The primary purpose of rib members 116, 116a, 118, 118a is to provide greater mass and rigidity to manifold 84, 84a thereby making manifold 84, 84a less susceptible to warping or distortion when heated liquids are circulated therethrough for prolonged periods of time. The preferred method of forming the tubular periphery and inner pipe members 100, 100a, 102, 102a with rib members 116, 116a, 118, 118a formed thereon is through an extrusion process.

A second advantage to the utilization of rib members 116, 116a, 118, 118a and mo particularly lower rib member 116, 116a pertains to the mounting of nozzles 68 to the manifold 84, 84a. In this respect, lower rib member 116, 116a eliminates the need for mounting nipples 46, 46a as illustrated in the first embodiment of the present invention.

Figure 11:
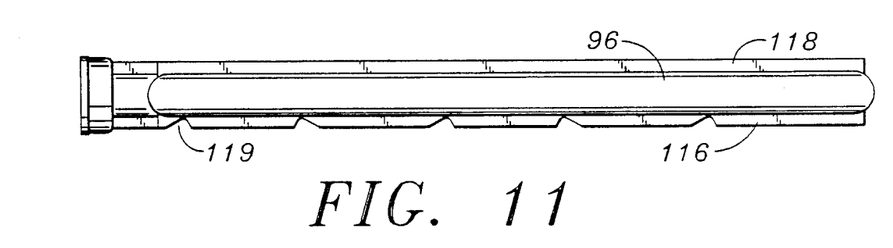
FIG. 11 is an elevational view of the spray manifold of FIG. 9.
Figure 12:
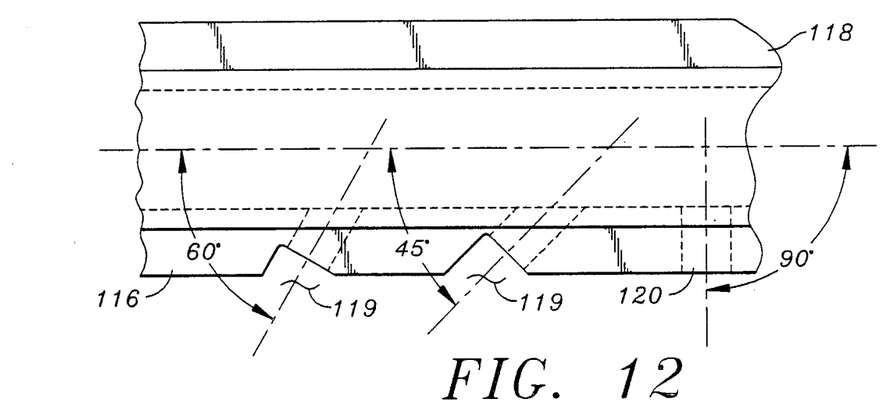
FIG. 12 is a sectional view of a segment of the spray manifold of FIG. 1 including added illustrations of three (3) possible angular orientations of the nozzle mounting recesses disposed within the rib member formed thereon.

Referring now to FIGS. 11-13, the formation of manifold 84, 84a with rib members 116, 116a allows a plurality of nozzle mounting recesses 119, 119a to be disposed directly within lower rib member 116, 116a of pipe segments 92, 92a, 96, 96a and inner pipe members 100, 100a, 102, 102a. Importantly, such nozzle mounting recesses 119, 119a are utilized when it is desired to mount nozzle 60 within manifold 84, 84a with a generally angular orientation. Mounting recesses 119, 119a may be cut within lower rib member 116, 116a at any angle necessary to facilitate the desired pattern and/overlap of the individual sprays emanating therefrom. As seen in FIG. 12, the configurations of mounting recesses 119 will vary according to the particular angle at which nozzle 68 is to be mounted, such configurations being shown for mounting the nozzle 68 at 45° or 60° angles. As also seen in FIG. 12, when mounting a nozzle 68 at a 90° angle, no recess 119 need be cut into lower rib member 116. In this respect, an aperture 120 extending axially through rib member 116 is all that is needed to attach the nozzle 68 thereto. As can be appreciated, the use of nozzle mounting recesses 119, 119a as opposed to mounting nipples 46, 46a as disclosed in the first embodiment, eliminates one potential area for leakage within the manifold 84, 84a (i.e. the connection between nipples 46, 46a and manifold 10, 10a of the first embodiment). Additionally, the use of recesses 119, 119a simplifies the construction of manifold 84, 84a in that no separate nipple mounting operation need be conducted.

Referring now to FIG. 13, recessed portion 119 is generally formed to define two planar surfaces 122, 124. Disposed within either of planar surfaces 122, 124 is a threaded bore 126 which extends axially downwardly from either of surfaces 122, 124 through rib member 116 thereby fluidly connecting nozzle 68 to the manifold 84. In the second embodiment, the threaded portion 74 of nozzle 68 is sized such that when received into threaded bore 126, shoulder 75 defined by outer body 70 may be abutted against planar surface 122 without threaded portion 74 protruding into the interior of the manifold 84. Thus, fluid may flow through the manifold 84 and out nozzle 68 with a minimum of turbulence or disruption. In addition to allowing fluid to flow with a minimum of turbulence or disruption, the tubular periphery, inner tubular members and spray nozzles of the manifold 84 are formed to be nondegradable when contacted by caustic chemical solutions used in the production of printed circuit boards.

Figure 14:
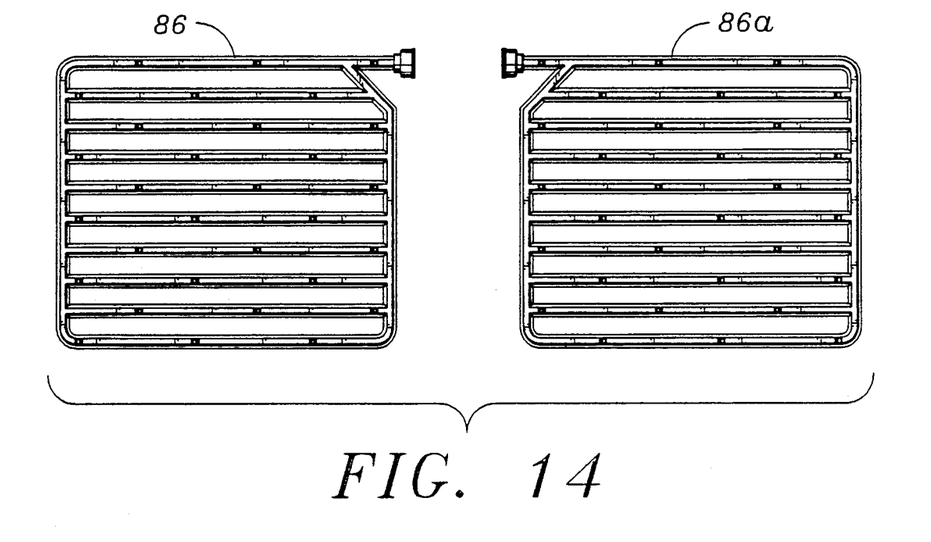
FIGS. 14-16 show several different sized manifolds, all of which embody the second embodiment of the present invention.
Figure 15:
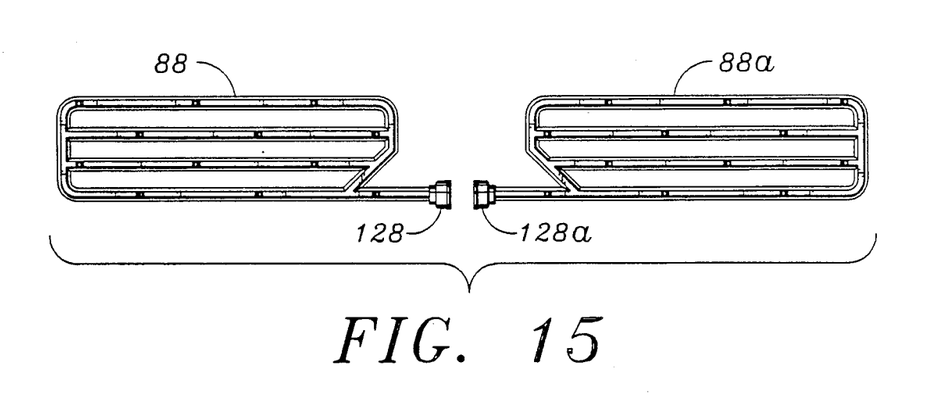
Figure 16:
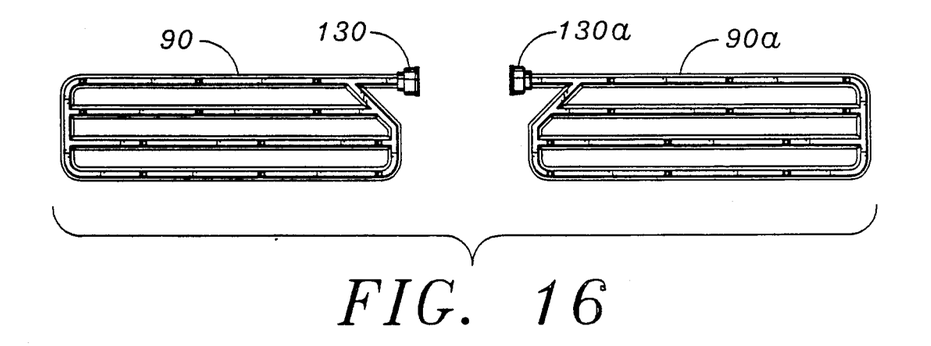

FIGS. 14-16 show several different sized manifolds, all of which embody the second embodiment of the present invention. Specifically, FIG. 14 shows manifolds 86, 86a having a generally rectangular tubular periphery with eight (8) inner pipe members positioned transversely therewithin. Manifold 86 is fitted for right hand connection while manifold 86a if fitted for left hand connection. Thus, manifolds 86, 86a are essentially mirror images of one another. The nozzle pattern shown on manifolds 86, 86a is staggered. However, it will be appreciated that any nozzle pattern may be employed depending on the intended application and desired spray pattern.

FIG. 15 shows spray manifolds 88, 88a which comprise a generally rectangular outer periphery with two (2) inner pipe members positioned transversely therewithin. The manifolds 88, 88a are fitted for right and left hand connection respectively and are therefore mirror images of one another. The nozzle pattern shown on the manifolds 88, 88a is staggered. However, it will be appreciated that any nozzle pattern may be employed depending upon the desired application and spray pattern. The nozzles 88, 88a are provided with longer, extended couplings 128, 128a which extend outwardly from each manifold 88, 88a.

FIG. 16 shows manifolds 90, 90a, each comprising a generally rectangular outer periphery with two (2) transverse inner pipe members positioned therein. The manifolds 90, 90a differ from manifolds 88, 88a only in that they incorporate non-extended couplings 130, 130a instead of the longer, extended couplings 128, 128a shown on manifolds 88, 88a.

Figure 17:
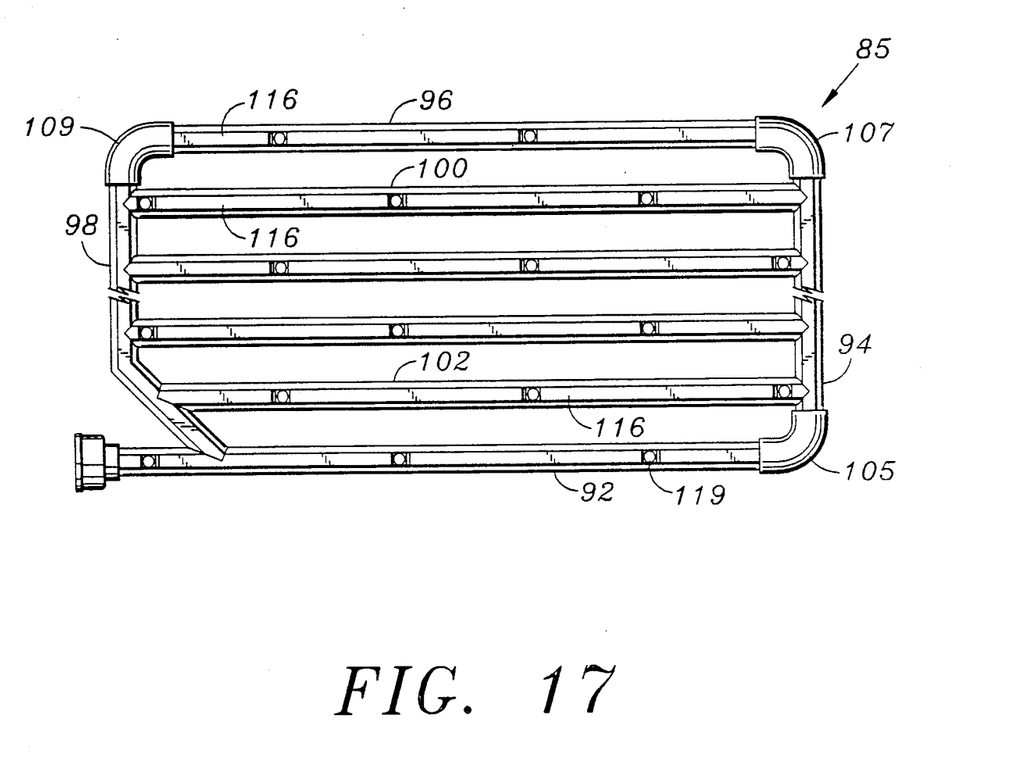
FIG. 17 is a plan view of a spray manifold of a first embodiment of the present invention constructed from a plurality of interconnected tubular members.

FIG. 17 shows the spray manifold 85 wherein the first 92, second 94, third 96 and fourth 98 pipe segments comprise individual components as do the inner pipe members 100 and 102. In this respect, elbow members 105, 107 and 109 are used to fluidly connect the first 92, second 94, third 96 and fourth 98 pipe segments to form the tubular periphery of the manifold 85.

Although the invention has been described herein with particular reference to presently preferred embodiments thereof, it will be appreciated that many modifications, additions and deletions may be made to such preferred embodiments without departing from the spirit and scope of the invention. For example, many patterns and positioning of the nozzles may be employed to effect any desired spray pattern. Furthermore, the manifolds may be adapted for right or left hand feed depending on the type of machinery in which the manifold is to be placed. Accordingly, it is intended that these and other modifications, alterations and additions be included within the scope of the following claims and the equivalents thereof.

What is claimed is:

1. A spray manifold for spraying liquid chemicals on planar workpieces such as printed circuit boards passing adjacent the manifold said manifold comprising:
   a generally rectangular, tubular periphery;
   a plurality of inner tubular members fluidly connected to said tubular periphery and extending therewithin, each of said inner tubular members having at least one longitudinally extending rib member formed thereon for providing greater structural rigidity to said manifold; and
   a plurality of spray nozzles mounted within the rib member of at least some of said inner tubular members, said spray nozzles being arrayed within the rib member to spray liquid chemicals upon the surface of the workpiece passing adjacent the manifold.

2. A spray manifold for spraying liquid chemicals on planar workpieces such as printed circuit boards passing adjacent the manifold said manifold comprising:
   a generally rectangular, tubular periphery;
   a plurality of inner tubular members fluidly connected to said tubular periphery and extending therewithin, each of said inner tubular members having at least one longitudinally extending rib member formed thereon for providing greater structural rigidity to said manifold; and
   a plurality of spray nozzles mounted within the rib member of at least some of said inner tubular members, said spray nozzles being arrayed within the rib member to spray liquid chemicals upon the surface of the workpiece passing adjacent the manifold; and
   said tubular periphery being formed to join circulating liquid with liquid entering the manifold in a manner facilitating reduced turbulence to maintain even liquid pressure within the manifold and thereby discharge an even coating of liquid upon a surface of the adjacent workpiece.

3. The spray manifold of claim 2 wherein said generally rectangular tubular periphery comprises:
   first, second and third elongate tubular members and a fourth angled tubular member, each having first and second ends and at least one longitudinally extending rib member formed thereon;
   the first end of said first elongate tubular member being connectable to a pressurized fluid supply source;
   the second end of said first tubular member being fluidly connected to the first end of said second tubular member such that said second tubular member extends generally perpendicular to said first tubular member;
   the second end of said second tubular member being fluidly connected to the first end of said third tubular such that said third tubular member extends generally perpendicular to said second tubular member;
   the second end of said third tubular member being fluidly connected to the first end of said angular fourth tubular member; and
   the second end of said angular fourth tubular member being fluidly connected to said first tubular member at a point between the first and second ends thereof.

4. The spray manifold of claim 3 wherein the connection between said angular fourth tubular member and said first tubular member is such that circulating liquid flowing from said fourth tubular member will enter said first tubular member at an acute angle relative to liquid entering the first end of the first tubular member from the liquid supply source so as to join therewith in a manner facilitating reduced turbulence.

5. The spray manifold of claim 4 wherein said plurality of nozzles are mounted individually at points within said at least one rib member of said inner tubular members and said at least one rib member of said first tubular member and said third tubular member.

6. The spray manifold of claim 5 wherein said at least one rib member of said inner tubular members and said first and third tubular members includes a plurality of bores disposed therein, said bores being threaded so that a nozzle may be screwed thereinto and further being adapted such that liquid from said inner tubular members and said tubular periphery passes into said nozzles with a minimum of turbulence and disruption thereof.

7. The spray manifold of claim 4 wherein a plurality of apertures are formed in said tubular periphery and further wherein said inner tubular members comprise segments of pipe having first and second ends, said first and second ends being radially cut so as to be positionable against the outer surface of said tubular periphery such that each of said apertures will open into one of said inner tubular members, thereby facilitating flow of liquid from the tubular periphery into the inner tubular members.

8. The spray manifold of claim 7 wherein said inner tubular members comprise straight sections of pipe arranged generally parallel to one another.

9. The spray manifold of claim 8 wherein said inner tubular members are positioned within said rectangular periphery so as to be in parallel relation to said first and third tubular members.

10. The spray manifold of claim 3 wherein curved elbow members are used to connect said first, second and third tubular members for forming said three sides of said generally rectangular periphery.

11. The spray manifold of claim 2 wherein said generally rectangular tubular periphery comprises an elongate member having a first end and a second end and at least one longitudinally extending rib member formed thereon for providing greater structural rigidity to said manifold, said elongate member being bent to form said rectangular tubular periphery wherein the first end is connectable to a pressurized liquid supply source and said second end is fluidly connected to the elongate member at a point adjacent the first end.

12. The spray manifold of claim wherein the connection between the second end and the elongate member is such that circulating liquid flowing from the second end will enter the elongate member at an acute angle relative to liquid entering the first end from the liquid supply source so as to join therewith in a manner facilitating reduced turbulence.

13. The spray manifold of claim 12 wherein said plurality of nozzles are mounted individually at points within said at least one rib member of said inner tubular members and said at least one rib member of said elongate member.

14. The spray manifold of claim 13 wherein said at least one rib member of said inner tubular members and said elongate member includes a plurality of bores disposed therein, said bores being threaded so that a nozzle may be screwed thereinto and further being adapted such that liquid from said inner tubular members and said tubular periphery passes into said nozzles with a minimum of turbulence and disruption thereof.

15. The spray manifold of claim 12 wherein a plurality of apertures are formed in said tubular periphery and further wherein said inner tubular members comprise segments of pipe having first and second ends, said first and second ends being radially cut so as to be positionable against the outer surface of said tubular periphery such that each of said apertures will open into one of said inner tubular members, thereby facilitating flow of liquid from the tubular periphery into the inner tubular members.

16. The spray manifold of claim 15 wherein said inner tubular members comprise straight sections of pipe arranged generally parallel to one another.

17. The spray manifold device of claim 13 wherein said at least one rib member formed on said inner tubular members and said elongate member comprises a first rib member and a second rib member, said nozzles being mounted within said first rib member.

18. The spray manifold of claim 1 wherein the tubular periphery, inner tubular members and spray nozzles are formed to be non-degradable when contacted by caustic chemical solutions used in the production of printed circuit boards.

19. The spray manifold of claim 18 wherein said tubular periphery and said inner tubular members are formed of extruded plastic.

20. The spray manifold of claim 1 wherein each of said nozzles comprises a plastic outer body having an inner core formed of abrasion resistant material.

21. The spray manifold of claim 20 wherein said at least one spray nozzle comprises a polypropylene outer body having a ceramic core position therein.

22. The reinforced spray manifold for spraying liquid chemicals on planar workpieces such as printed circuit boards passing adjacent the manifold, said manifold comprising:
 a generally rectangular, tubular periphery comprising first, second and third generally straight tubular members fluidly connected in end-to-end fashion to form three sides of said generally rectangular periphery and a fourth non-straight tubular member having an angular bend formed therein, each of said first, second, third and fourth tubular members having first and second ends and including at least one longitudinally extending rib member formed thereon for providing greater structural rigidity to said manifold;
 the first end of said first tubular member being connectable to a pressurized liquid supply source;
 the second end of said fourth tubular member being connected to said first tubular member such that circulating liquid flowing from said fourth tubular member will enter said first tubular member at an acute angle relative to liquid entering the first end of said first tubular member from said liquid supply source so as to join therewith in a manner facilitating reduced turbulence to maintain even liquid pressure within the manifold and thereby discharge an even coating of liquid upon a surface of the adjacent workpiece;
 a plurality of inner tubular members fluidly connected to said tubular periphery and extending therewithin, each of said inner tubular members including at least one longitudinally extending rib member formed thereon for providing greater structural rigidity to said manifold; and
 a plurality of spray nozzles mounted within said at least one rib member of at least some of said inner tubular members and said at least one rib member of said first and third tubular members, said spray nozzles being arrayed within said first and third tubular members and said inner tubular members to spray liquid chemicals upon the surface of a workpiece passing adjacent the manifold.

* * * * *